US012696466B2

(12) United States Patent
Tadjer et al.

(10) Patent No.: US 12,696,466 B2
(45) Date of Patent: Jul. 28, 2026

(54) GALLIUM OXIDE PLANAR MOS-SCHOTTKY RECTIFIER

(71) Applicant: The Government of the United States of America, as represented by the Secretary of the Navy, Arlington, VA (US)

(72) Inventors: Marko J. Tadjer, Vienna, VA (US); Hannah N. Masten, Alexandria, VA (US); Joseph A. Spencer, Springfield, VA (US); Alan G. Jacobs, Rockville, MD (US); Karl D. Hobart, Alexandria, VA (US); Yuhao Zhang, Blacksburg, VA (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 544 days.

(21) Appl. No.: 18/308,948

(22) Filed: Apr. 28, 2023

(65) Prior Publication Data

US 2023/0352600 A1 Nov. 2, 2023

Related U.S. Application Data

(60) Provisional application No. 63/336,321, filed on Apr. 29, 2022.

(51) Int. Cl.
H10D 8/60 (2025.01)
H10D 62/80 (2025.01)
(Continued)

(52) U.S. Cl.
CPC ............... H10D 8/60 (2025.01); H10D 62/80 (2025.01); H10D 99/00 (2025.01);
(Continued)

(58) Field of Classification Search
CPC ........ H01L 21/02483; H01L 21/02581; H10D 62/129; H10D 62/875
See application file for complete search history.

(56) References Cited

U.S. PATENT DOCUMENTS 10,825,935 B2 11/2020 Sasaki et al.
11,081,598 B2 8/2021 Sasaki et al.
(Continued)

FOREIGN PATENT DOCUMENTS

| JP | 2003068761 A | * | 3/2003 | |
| WO | WO-2021044644 A1 | * | 3/2021 | ............. H10P 14/432 |
| WO | WO-2021186936 A1 | * | 9/2021 | ............. H10D 64/00 |

OTHER PUBLICATIONS

J. B. Varley, et al., "Role of self-trapping in luminescence and p-type conductivity of wide-band-gap oxides." Physical Review B 85, No. 8 (2012): 081109.

(Continued)

*Primary Examiner* — William B Partridge
*Assistant Examiner* — Felix B Andrews
(74) *Attorney, Agent, or Firm* — US Naval Research Laboratory; Jorie L. Stroup

(57) ABSTRACT

Ga₂O₃-based rectifier structure and method of forming the same. A Schottky diode structure is combined with a metal-oxide-semiconductor structure to provide a metal oxide-type Schottky barrier diode (MOSSBD) rectifier that includes an n-type β-Ga₂O₃ drift layer on a β-Ga₂O₃ substrate, the drift layer having a plurality of spaced-apart semi-insulating regions formed by in-situ ion implantation of acceptor species at predefined spatially defined regions of the drift layer to create alternating areas of n-type and semi-insulating regions within the n-type drift layer. The thus-formed structure achieves high forward bias current with low specific on-resistance when the anode is biased with positive (Continued)

voltage and low leakage current when the device is operated under reverse bias.

20 Claims, 10 Drawing Sheets

(51) Int. Cl.
    *H10D 99/00*          (2025.01)
    *H10P 14/20*          (2026.01)
(52) U.S. Cl.
    CPC ...... *H10P 14/2918* (2026.01); *H10P 14/3434* (2026.01); *H10P 14/3442* (2026.01)

(56) References Cited

U.S. PATENT DOCUMENTS

| | | | | |
|---|---|---|---|---|
| 11,152,225 | B1 * | 10/2021 | Hara | ..................... H01L 21/477 |
| 11,563,092 | B2 | 1/2023 | Higashiwaki et al. | |
| 2013/0119394 | A1 | 5/2013 | Zhu et al. | |
| 2014/0175457 | A1 * | 6/2014 | Yen | ........................ H10D 64/64 |
| | | | | 257/77 |
| 2020/0066921 | A1 | 2/2020 | Li et al. | |
| 2021/0013314 | A1 | 1/2021 | Hu et al. | |
| 2021/0384362 | A1 | 12/2021 | Li et al. | |

OTHER PUBLICATIONS

M. Mehrotra and B.J. Baliga, "Trench MOS Barrier (TMBS) Rectifier: A Schottky Rectifier with higher than parallel plane breakdown voltage," Solid-State Electron. 38 (4) 801-806, 1995.

Z. Hu et al., "Vertical fin Ga2O3 power field-effect transistors with on/off ratio >109," 2017 75th Annual Device Research Conference (DRC), South Bend, IN, USA, 2017, pp. 1-2, doi: 10.1109/DRC. 2017.7999512.

H.-C. Huang et al., "β-Ga2O3 FinFETs with ultra-low hysteresis by plasma-free metal-assisted chemical etching." Appl. Phys. Lett. 121, 052102 (2022).

Z. Jian et al., "Temperature-dependent current-voltage characteristics of ß-Ga2O3 trench Schottky barrier diodes." Appl. Phys. Lett. 116, 152104 (2020).

A. Kyrtsos et al., "On the feasibility of p-type Ga2O3." Appl. Phys. Lett. 112, 032108 (2018).

W. Li et al., "1230 V β-Ga2O3 trench Schottky barrier diodes with an ultralow leakage current of <1 μA/cm2." Appl. Phys. Lett. 113, 202101 (2018).

J. Lyons, "A survey of acceptor dopants for β-Ga2O3." 2018 Semicond. Sci. Technol. 33 05LT02.

T. Onuma, et al., "Modeling and interpretation of UV and blue luminescence intensity in b-Ga2O3 by silicon and nitrogen doping." Journal of Applied Physics 124, 075103 (2018).

K. Sasaki et al., "First Demonstration of Ga2O3 Trench MOS-Type Schottky Barrier Diodes." IEEE Electron Device Letters, vol. 38, No. 6, Jun. 2017.

M. Tadjer et al., "High resistivity halide vapor phase homoepitaxial ß-Ga2O3 films Co-doped by silicon and nitrogen." Appl. Phys. Lett. 113, 192102 (2018).

M. H. Wong et al., "All-ion-implanted planar-gate current aperture vertical Ga2O3 MOSFETs with Mg-doped blocking layer." Applied Physics Express 11, 064102 (2018).

Chia-Hung Lin et al., Vertical Ga2O3 Schottky Barrier Diodes With Guard Ring Formed by Nitrogen-Ion Implantation, IEEE Electron Device Letters (vol. 40, Issue: 9, Sep. 2019), pp. 1487-1490, Jul. 10, 2019.

Alena Nikolskaya et al., Ion implantation in β-Ga2O3: Physics and technology, Journal of Vacuum Science & Technology A 39, 030802 (2021), Mar. 26, 2021.

Search Report and Written Opinion mailed Aug. 11, 2023 in corresponding International Application No. PCT/US2023/066348.

* cited by examiner

Ga$_2$O$_3$ Planar
Schottky Barrier Diode (SBD)

Ga₂O₃ Trench Schottky Barrier Diode (Trench-SBD)

Ga₂O₃ Trench MOS-Schottky Barrier Diode (MOSSBD)

Ga₂O₃ Hetero-Junction Barrier Schottky (HJ-JBS) Diode

Implanted Semi-
Insulating Ga₂O₃
203

Epitaxial n-type Ga₂O₃
207

Dielectric
204

206

Anode n⁻ GO    SI GO    n⁻ GO    SI GO    n⁻ GO    SI GO    n⁻ GO

β-Ga₂O₃ N-type Drift Layer    202

β-Ga₂O₃ N⁺ Substrate    201

Cathode    205

No implant

Nitrogen implanted

J. Spencer et al., Appl. Phys. Lett. 121, 192102 (2022).

TABLE I. Summary of the LTLM and room temperature Hall effect measurement data and ion implant activation efficiency determined via SIMS.

| Implant | (a) Si | (b) Ge | (c) Sn |
|---|---|---|---|
| $R_c$ ($\Omega$ mm) | 1.2 | 3.1 | 2.3 |
| $R_{sh}$ ($\Omega$/sq) | 314 | 926 | 1676 |
| $\mu$ [cm$^2$/(V s)] | 93 | 78 | 63 |
| $n_{sh}$ (cm$^{-2}$) | $2.13 \times 10^{14}$ | $8.59 \times 10^{13}$ | $5.87 \times 10^{13}$ |
| Activation % (SIMS) | 64.7 | 40.3 | 28.2 |

J. Spencer et al., Appl. Phys. Lett. 121, 192102 (2022).

GALLIUM OXIDE PLANAR MOS-SCHOTTKY RECTIFIER

CROSS-REFERENCE

This Application is a Nonprovisional of and claims the benefit of priority under 35 U.S.C. § 119 based on U.S. Provisional Patent Application No. 63/336,321 filed on Apr. 29, 2022. The Provisional Application and all references cited herein are hereby incorporated by reference into the present disclosure in their entirety.

FEDERALLY-SPONSORED RESEARCH AND DEVELOPMENT

The United States Government has ownership rights in this invention. Licensing inquiries may be directed to Office of Technology Transfer, US Naval Research Laboratory, Code 1004, Washington, DC 20375, USA; +1.202.767.7230; techtran@nrl.navy.mil, referencing Navy Case #211048.

TECHNICAL FIELD

The present disclosure is related to the field of electronic devices, particularly to gallium oxide-based rectifier structures and method for fabricating the same.

BACKGROUND

Gallium oxide ($Ga_2O_3$) is an attractive material for power electronics due to its ultra-wide bandgap (4.6-4.9 eV), which gives rise to a very high critical electric field (6-8 MV/cm), and its substantially higher Baliga Figure of Merit (BFOM) compared to wide bandgap materials based on gallium nitride and silicon carbide semiconductors. In recent years, researchers in the fields of crystal growth, epitaxial film development, materials scientists, and electronic devices have made significant efforts to develop this material into a technological platform for high-power, fast-switching electronic devices. Recent developments stemming from these efforts have resulted in development of large-area substrates and epitaxial wafers, demonstration of shallow donors in Ga2O3 and its ternary alloy, $\beta$-(AlxGa1-x)2O3, lateral transistors with high breakdown voltage, and development of vertical transistor architectures such as the Fin-FET and current aperture FET (CAVET) that show exceptional promise for next-generation power electronics. However, two challenges persist: the ultra-low thermal conductivity of Ga2O3 and the impossibility of generating free hole carriers in this material due to self-trapping phenomena.

In conventional power semiconductor device technologies such as those based on Si and SiC, commercial rectifying diode devices are typically based on pn junctions, as both donors and acceptors exist in these materials. Because the reverse leakage current in metal-semiconductor Schottky (MOS) diodes is too high for a practical device, pn junctions are preferred in a variety of device architectures to enable very low on resistance in forward bias and low leakage current in reverse bias. Consequently, rectifiers incorporating both p and n regions yield a high breakdown voltage in reverse bias, as the pn junction enables regions depleted of carriers to form within the device and hold off the formation of high electric fields, ultimately resulting in a high power figure of merit for these device structures.

On the other hand, the Ga2O3 material system presents the unique challenge of the self-trapped hole (STH), making p-type conductivity in this material and its related alloys essentially impossible. See J. B. Varley, et al., "Role of self-trapping in luminescence and p-type conductivity of wide-band-gap oxides." *Physical Review B* 85, no. 8 (2012): 081109.

New solutions to obtain high breakdown voltage in devices based on $Ga_2O_3$ have involved a number of approaches, including but not limited to formation of heterostructure pn junctions (e.g., p-type NiO adjacent to n-type $Ga_2O_3$), trench-MOS rectifiers, heterostructure junction barrier Schottky (H-JBS) diodes, and Schottky diodes with various oxide field plates and termination regions. Such approaches have enabled the development of $Ga_2O_3$ rectifiers with extended performance and improved potential for ultra-high breakdown voltage, ultra-high power electronics.

The block schematics in FIGS. 1A-1D illustrate aspects of the prior art approaches mentioned above.

FIG. 1A shows a cross-sectional schematic of a textbook planar Schottky barrier diode with an anode contact to the epitaxial low-doped ($n^-$) semiconductor layer and a cathode contact to the highly-conductive ($n^+$) substrate. This device is simple to fabricate but is known to suffer from high reverse leakage current as it is mostly controlled by the barrier height of the Schottky barrier. The inclusion of p-type regions is known as a Junction Barrier Schottky (JBS) diode. In forward bias the performance resembles that of a classic Schottky diode; in reverse bias, the space charge regions formed between the p and the n type regions deplete the surface from carriers and reduce the reverse leakage current similarly to a pn diode. In the absence of p-type $Ga_2O_3$, the JBS approach is possible with other p-type materials such as p-type NiO. It is also possible to leverage a MOS interface instead of a pn junction to achieve a lateral depletion region in the MOS-SBD architecture proposed by Sasaki.

FIGS. 1B-1D illustrate several approaches to the design of improved Schottky diodes, including a $Ga_2O_3$ trench Schottky barrier diode (Trench-SBD) (FIG. 1B), in which the anode extends into the $\beta$-$Ga_2O_3$ N-drift layer; a $Ga_2O_3$ trench MOS-Schottky barrier diode (MOSSBD) (FIG. 1C), in which the anode extends into the $\beta$-$Ga_2O_3$ N-drift layer as in FIG. 1B, but with a dielectric layer being applied in the trenches; and a $Ga_2O_3$ hetero-junction barrier Schottky (HJ-JBS) diode (FIG. 1D), in which areas of P+ NiO are formed in the $\beta$-$Ga_2O_3$ N-drift layer.

However, there is still a need for a robust Schottky diode architecture for $Ga_2O_3$ which does not utilize p-type heterojunction technology or aggressive plasma-based dry etching of $Ga_2O_3$, both of which are susceptible to interfacial traps from the deposition or etching plasma. The proposed approach does not require etching and instead relies on the activation of both donors and acceptors in $Ga_2O_3$ to form conductive and semi-insulating regions instead.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides a $Ga_2O_3$-based rectifier structure and method of forming the same. In accordance with the present invention, a Schottky diode structure is combined with a metal-oxide-semiconductor structure to provide a planar metal oxide-type Schottky barrier diode (P-MOSSBD) rectifier having low on-resistance in forward bias and a low reverse current, high breakdown field in reverse bias.

A P-MOSSBD rectifier in accordance with the present invention includes a $\beta$-Ga$_2$O$_3$ n-type drift layer on a $\beta$-Ga$_2$O$_3$ substrate, with a plurality of spaced-apart semi-insulating regions being formed therein by in-situ ion implantation of acceptor species at predefined spatially defined regions of the drift layer to create alternating areas of n-type and semi-insulating regions within the n-type drift layer. The thus-formed structure achieves high forward bias current with low specific on-resistance when the anode is biased with positive voltage and low leakage current when the device is operated under reverse bias.

DETAILED DESCRIPTION

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides a Ga$_2$O$_3$-based rectifier structure and method of forming the same. In accordance with the present invention, a Schottky diode structure is combined with a metal-oxide-semiconductor structure to provide a planar metal oxide-type Schottky barrier diode (P-MOSSBD) rectifier having low on-resistance in forward bias and a low reverse current, high breakdown field in reverse bias.

A P-MOSSBD structure in accordance with the present invention includes a $\beta$-Ga$_2$O$_3$ n-type drift layer on a $\beta$-Ga$_2$O$_3$ substrate, the drift layer having a plurality of spaced-apart semi-insulating regions being formed therein by in-situ ion implantation of acceptor species at predefined spatially defined regions of the draft layer to create alternating areas of n-type and semi-insulating regions within the n-type drift layer. The thus-formed structure achieves high forward bias current with low specific on-resistance when the anode is biased with positive voltage and low leakage current when the device is operated under reverse bias.

This approach results in improved rectifying characteristics (particularly reverse leakage) without the need for trench etching, avoiding plasma damage, or the integration of dissimilar p-type materials in the device structure, avoiding trap states at the interface. This approach further takes advantage of the wide range of doping capability and the high crystal quality of epitaxial Ga$_2$O$_3$.

A number of species have been studied for their potential application as an acceptor in Gallium Oxide, including but not limited to Mg, Fe, N, Co, Zn, etc. Theoretically, an even wider range of species have been shown to not be viable acceptors in Ga2O3. In every case, these impurities are energetically positioned too far from the valence band of Ga2O3, a.k.a., they are energetically too deep to ionize and become electrically active. Furthermore, even if holes were possible to form, they would be of extremely low mobility as they would essentially self-trap at the acceptor site.

Figure 2:
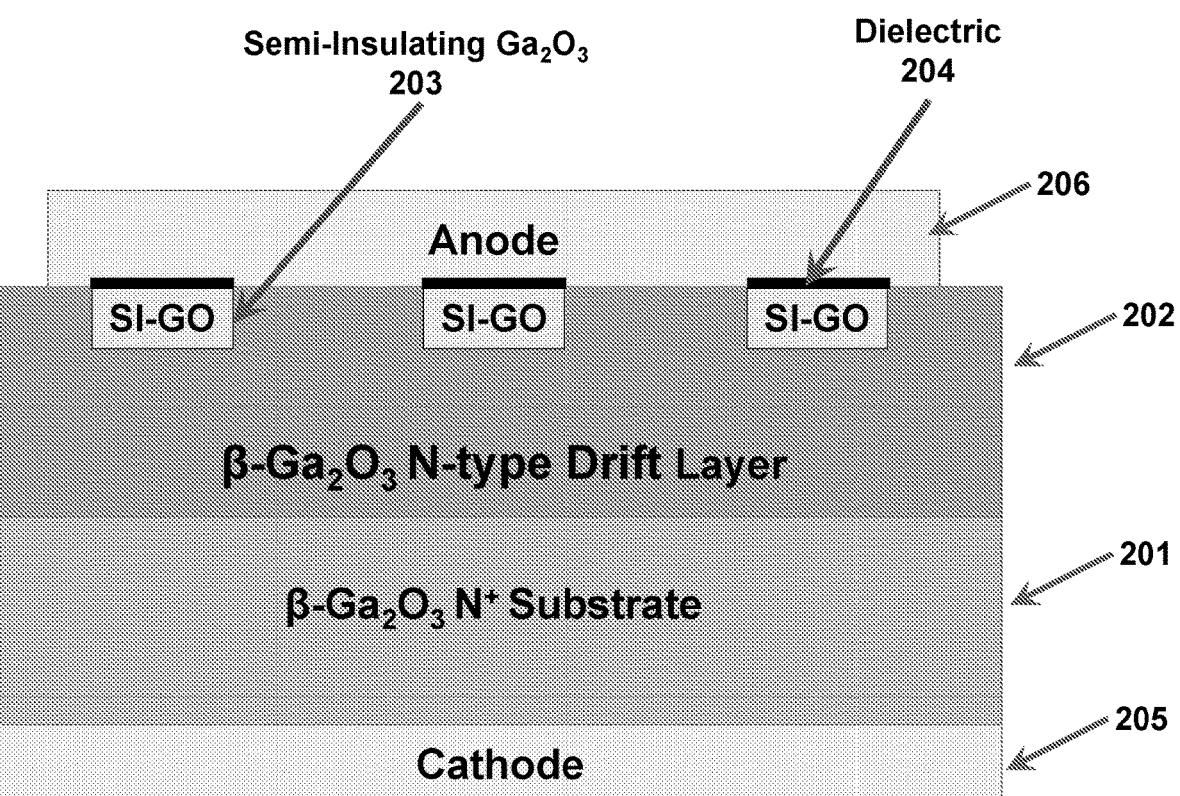
FIG. 2 is a block schematic illustrating an exemplary planar metal oxide-type Schottky barrier diode (P-MOSSBD) device in accordance with the present invention.

The block schematic in FIG. 2 illustrates an exemplary P-MOSSBD structure in accordance with the present invention.

As illustrated in FIG. 2, such a structure includes a $\beta$-Ga$_2$O$_3$ substrate 201 having a $\beta$-Ga$_2$O$_3$ n-type drift layer 202, which has been doped with donor ions such as Silicon (Si) or Germanium (Ge), both energetically shallow donors in Ga$_2$O$_3$, formed thereon. Tin (Sn) is also an energetically shallow donor in Ga$_2$O$_3$, but it tends to form clusters that can potentially lead to gamma-phase inclusions and is thus not as preferable as Si or Ge. Drift layer 202 is patterned, e.g., through the use of a mask or by any other suitable method, to define a plurality of spaced-apart regions to be implanted with acceptor dopants to form a plurality of semi-insulating trenches 203 within the n-type Ga$_2$O$_3$. In such a way, in accordance with the present invention, a Ga$_2$O$_3$ material having a plurality of alternating n-type and semi-insulating (SI) regions can be formed without the need for etching or otherwise patterning the Ga$_2$O$_3$ to form such trenches.

Acceptor dopants that can be implanted into the drift layer can include N, Mg, Co, Fe, Be, Ca, Sr, Zn, or Cd. Such acceptors are energetically deep acceptors with ionization energy too far above the valence band of Ga2O3. As such, they do not form electrically-active p-type regions or pn junctions when implanted into the —Ga$_2$O$_3$. Therefore, a homojunction approach to reducing reverse leakage current and improving breakdown voltage in Ga2O3 via pn junction induced space charge regions is not viable.

The spacing, width, and depth of the doped SI, with the trenches being uniformly or non-uniformly spaced, can be tailored for particular device applications. For example, a deeper SI region may result in increased on-state resistance but also lead to improved breakdown voltage. Those skilled in the art will recognize that the optimization of the N-type $Ga_2O_3$ Schottky regions (width, depth, doping level), SI—$Ga_2O_3$ MOS regions (width, depth, doping level) will address tradeoffs in on-state resistance, breakdown voltage, barrier height, turn-on voltage, reverse leakage current, reverse recovery time, transit time, switching performance, etc., of the P-MOSSBD diode.

In many embodiments, an optional dielectric layer 204 (e.g., $Al_2O_3$ or $HfO_2$) is deposited on the trenches 203, with the device connected to a power source via cathode 205 and anode 206.

Figure 3:
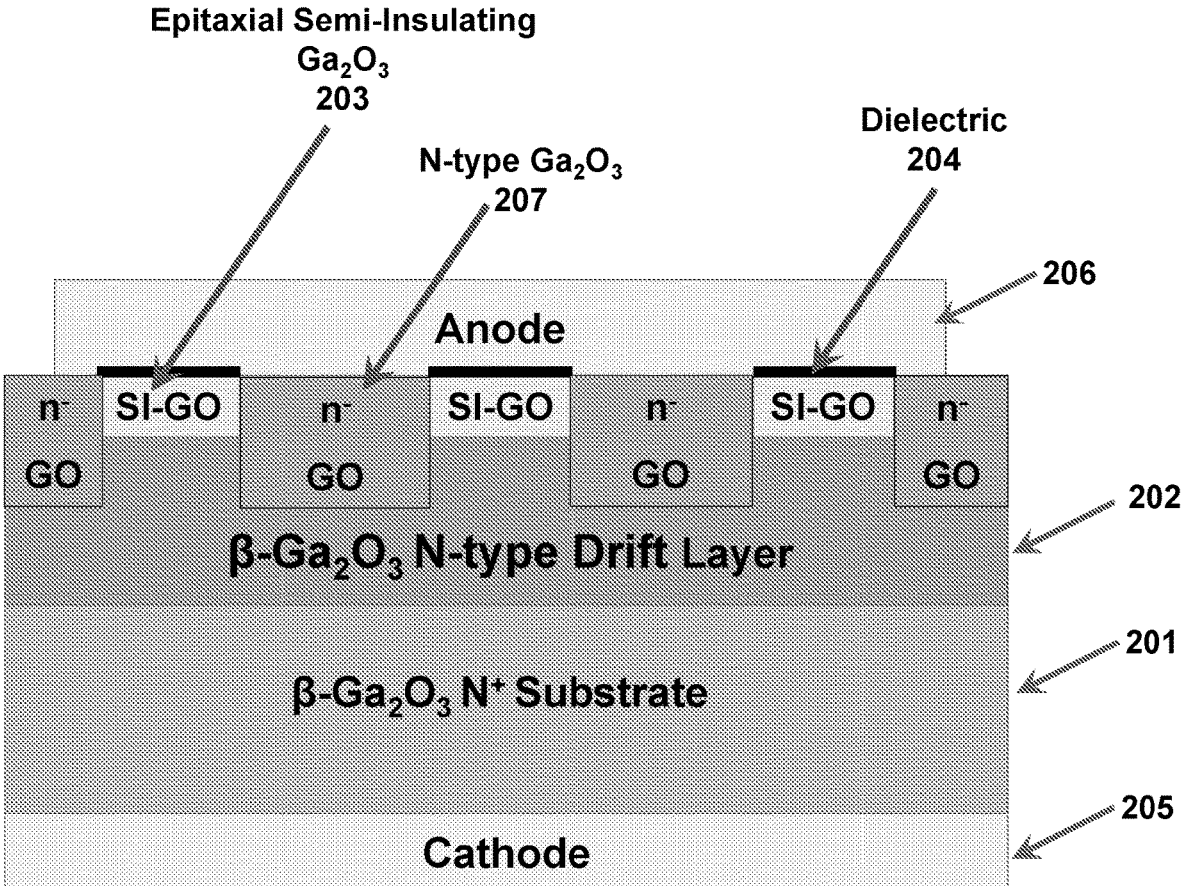
FIG. 3 is a block schematic illustrating an exemplary P-MOSSBD device structure in accordance with the present invention.

FIG. 3 is a block schematic illustrating an exemplary P-MOSSBD device in accordance with the present invention, where the device includes an epitaxial N-type $Ga_2O_3$ drift layer 202, epitaxial Semi-Insulating $Ga_2O_3$ layer ("SI-GO") 203, and selectively donor-implanted (e.g., Si, Ge, Sn, etc.) n-type $Ga_2O_3$ regions 207 within the SI-GO layer 203 and extending into the drift layer 202, where the Schottky area of the P-MOSSBD device is defined by the areas of contact between anode 206 and the implanted areas 207 and the non-implanted SI-GO regions 203 defining the MOS area of the device.

Figure 4:
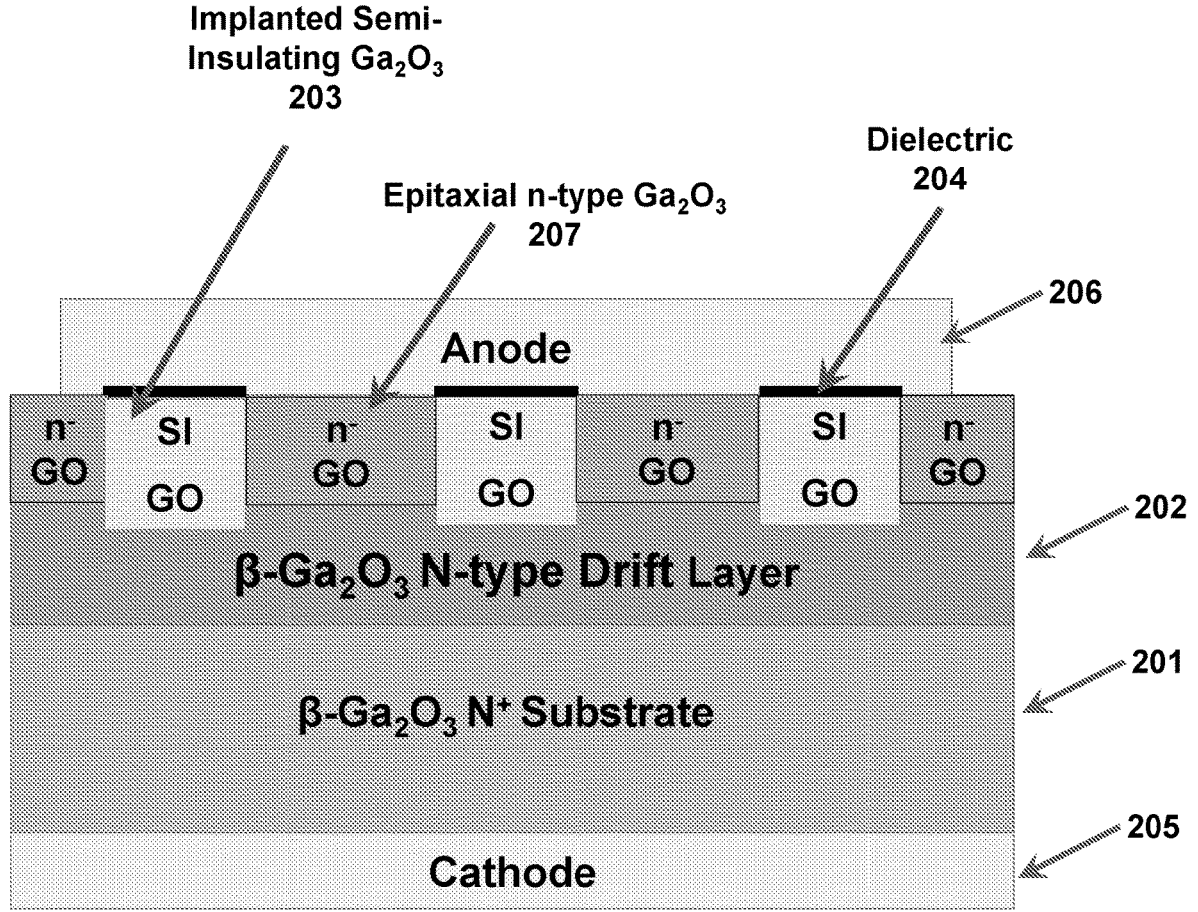
FIG. 4 is a block schematic illustrating a second embodiment of a P-MOSSBD device in accordance with the present invention.

FIG. 4 is a block schematic illustrating an alternative embodiment of a P-MOSSBD device in accordance with the present invention. In this embodiment, an epitaxial N" $Ga_2O_3$ layer ("n-GO") 207 is formed on drift layer 202, with acceptors being selectively implanted into the N-GO layer to form semi-insulating $Ga_2O_3$ (SI-GO) regions 203 in the n-GO layer. In this embodiment, the Schottky area of the P-MOSSBD device is defined by the areas of contact between anode 206 and the implanted areas 207 and the non-implanted SI-GO regions 203 defining the MOS area of the device.

Figure 5:
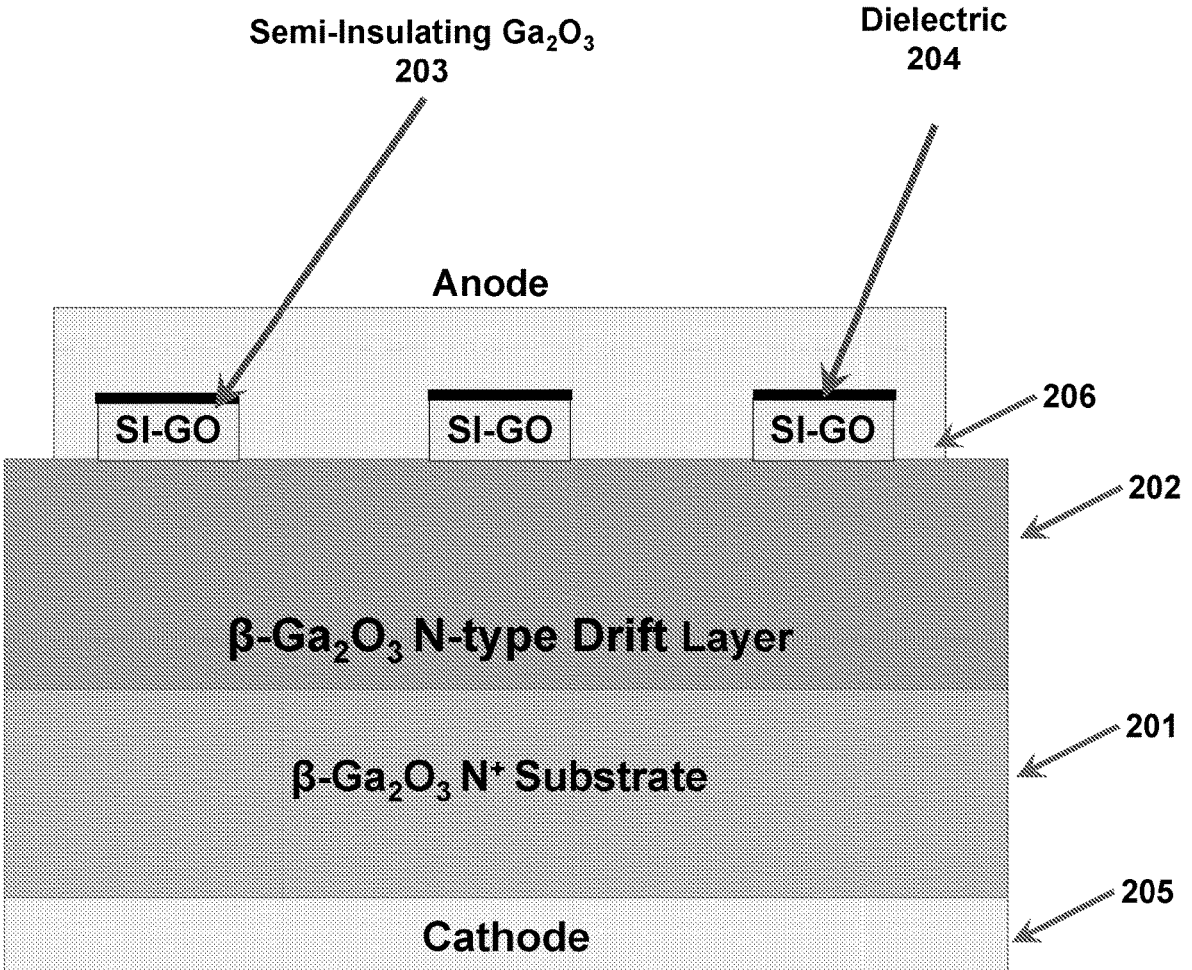
FIG. 5 is a block schematic illustrating a third embodiment of a P-MOSSBD device in accordance with the present invention.

FIG. 5 is a block schematic illustrating a third embodiment of a P-MOSSBD device in accordance with the present invention. In this embodiment, areas of semi-insulating $Ga_2O_3$ (SI-GO) 203 are formed on the drift layer 202, either via selective epitaxy or pattering of a planar epitaxial layer via etching, where the Schottky areas and MOS areas of the device are as described above.

Figure 6:
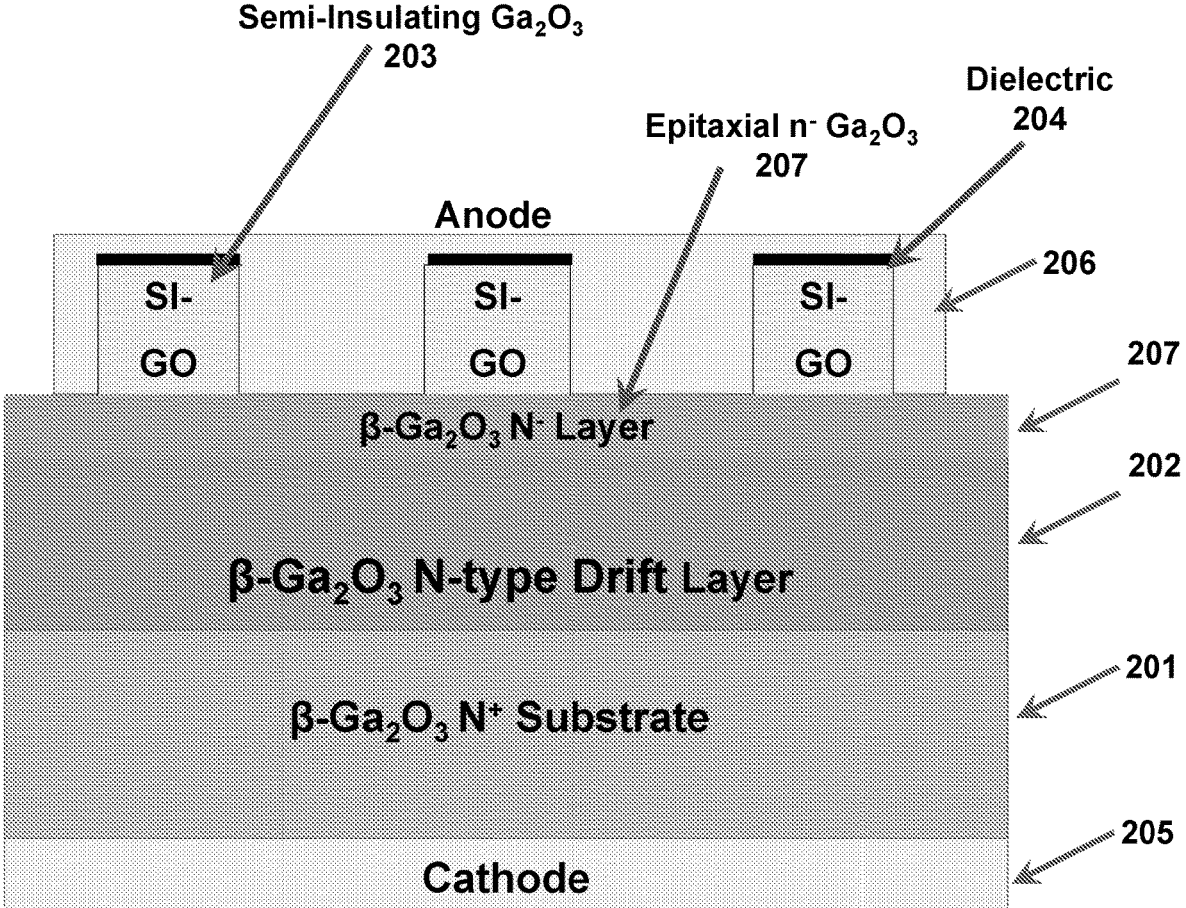
FIG. 6 is a block schematic illustrating a fourth embodiment of a P-MOSSBD device in accordance with the present invention.

FIG. 6 is a block schematic illustrating a fourth embodiment of a P-MOSSBD device in accordance with the present invention. In this embodiment, areas of semi-insulating $Ga_2O_3$ are formed on epitaxial N—$Ga_2O_3$ layer 207 either via selective epitaxy or pattering of a planar epitaxial layer via etching, where the Schottky areas and MOS areas of the device are as described above.

Figure 1A:
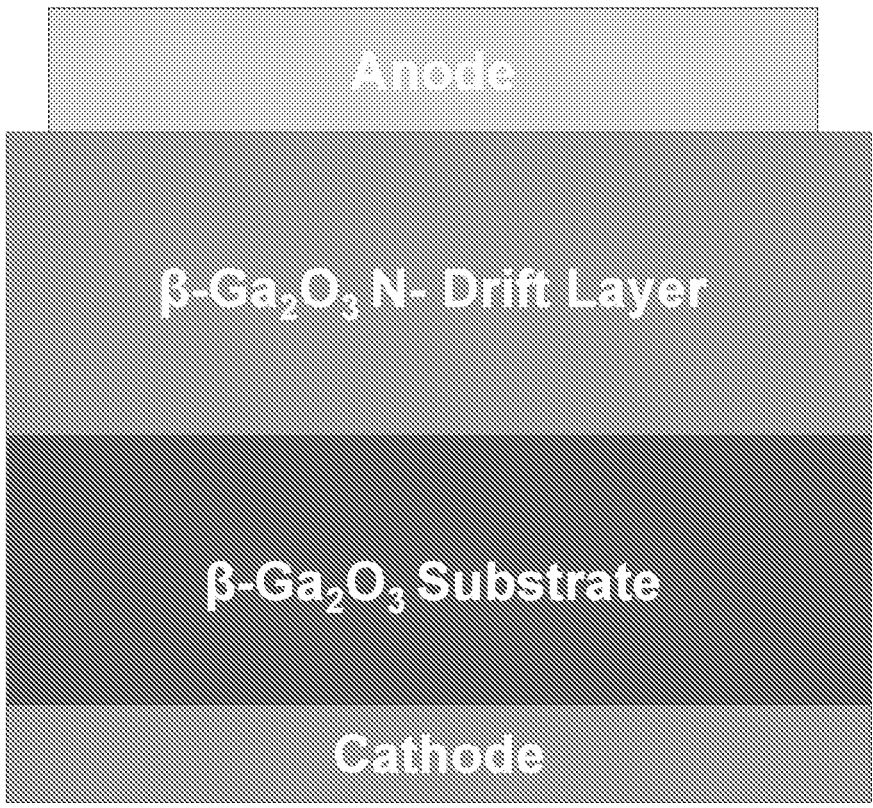
FIGS. 1A-1D are block schematics illustrating exemplary state of the art techniques for the fabrication of Ga$_2$O$_3$ planar, junction barrier, and trench-MOS Schottky diodes.
Figure 1B:
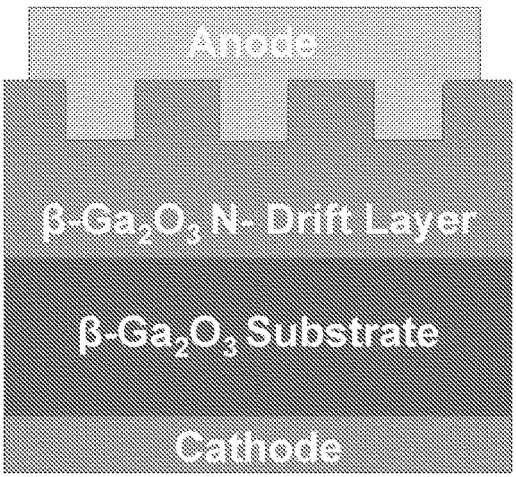
Figure 1C:
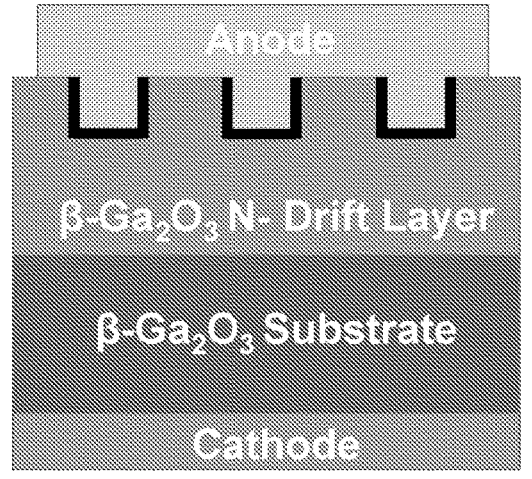
Figure 1D:
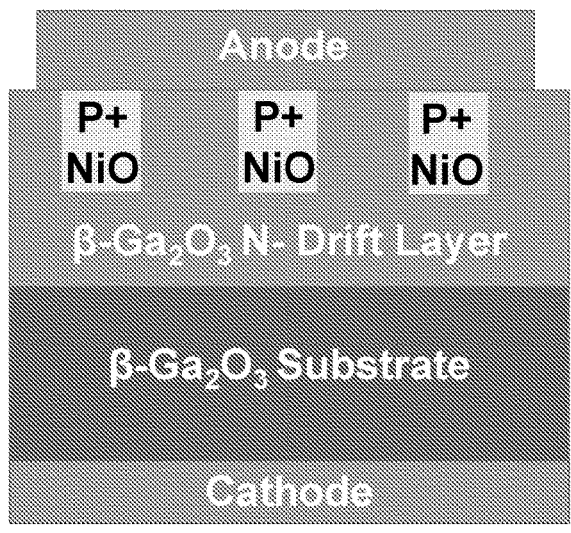
Figure 7A:
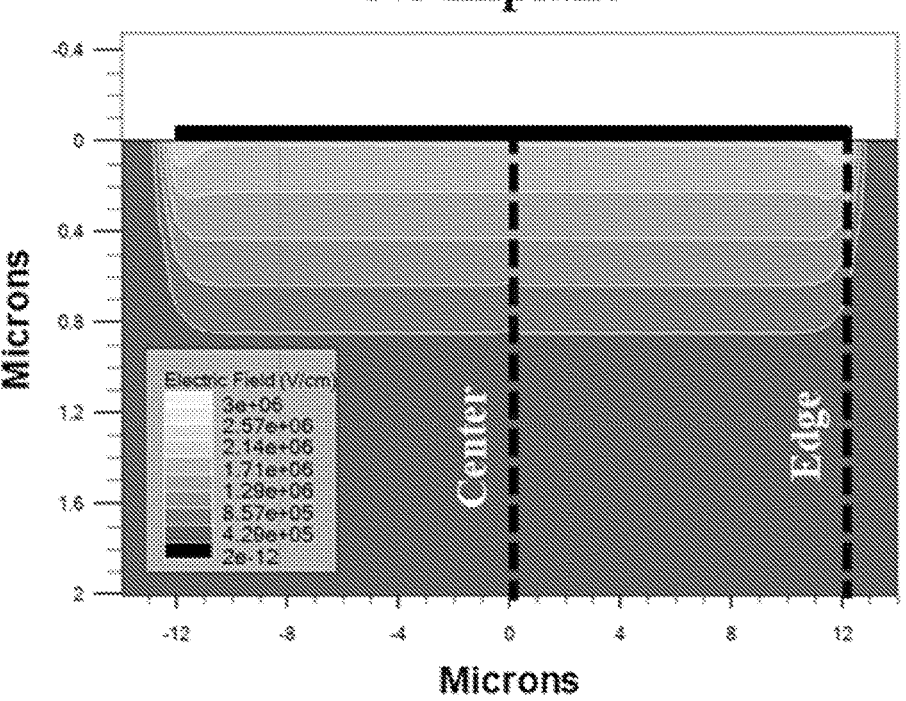
FIGS. 7A and 7B are plots showing the simulated electric filed profile of a planar MOSSBD device without Nitrogen-implanted regions (FIG. 7A) and with Nitrogen-implanted regions in accordance with the present invention (FIG. 7B).
Figure 7B:
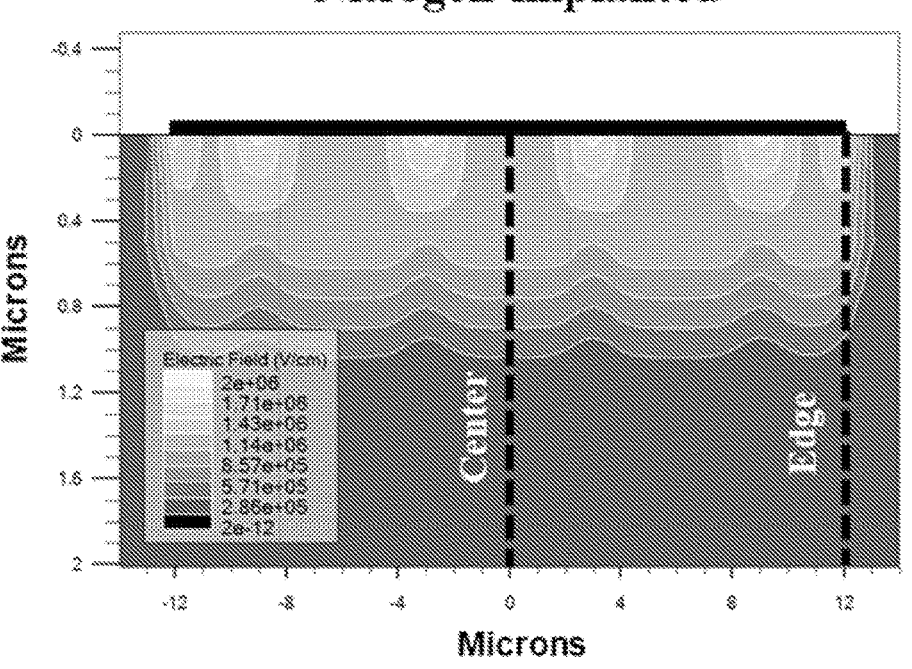

FIG. 7A shows the simulated electric field profile of a planar $Ga_2O_3$ Schottky diode shown in FIG. 1A, while FIG. 7B shows the simulated electric field profile of a planar MOS-SBD diode with epitaxial n-type regions and Nitrogen-implanted SI—Ga2O3 regions, as illustrated in FIG. 4.

Figures 8A, 8B:
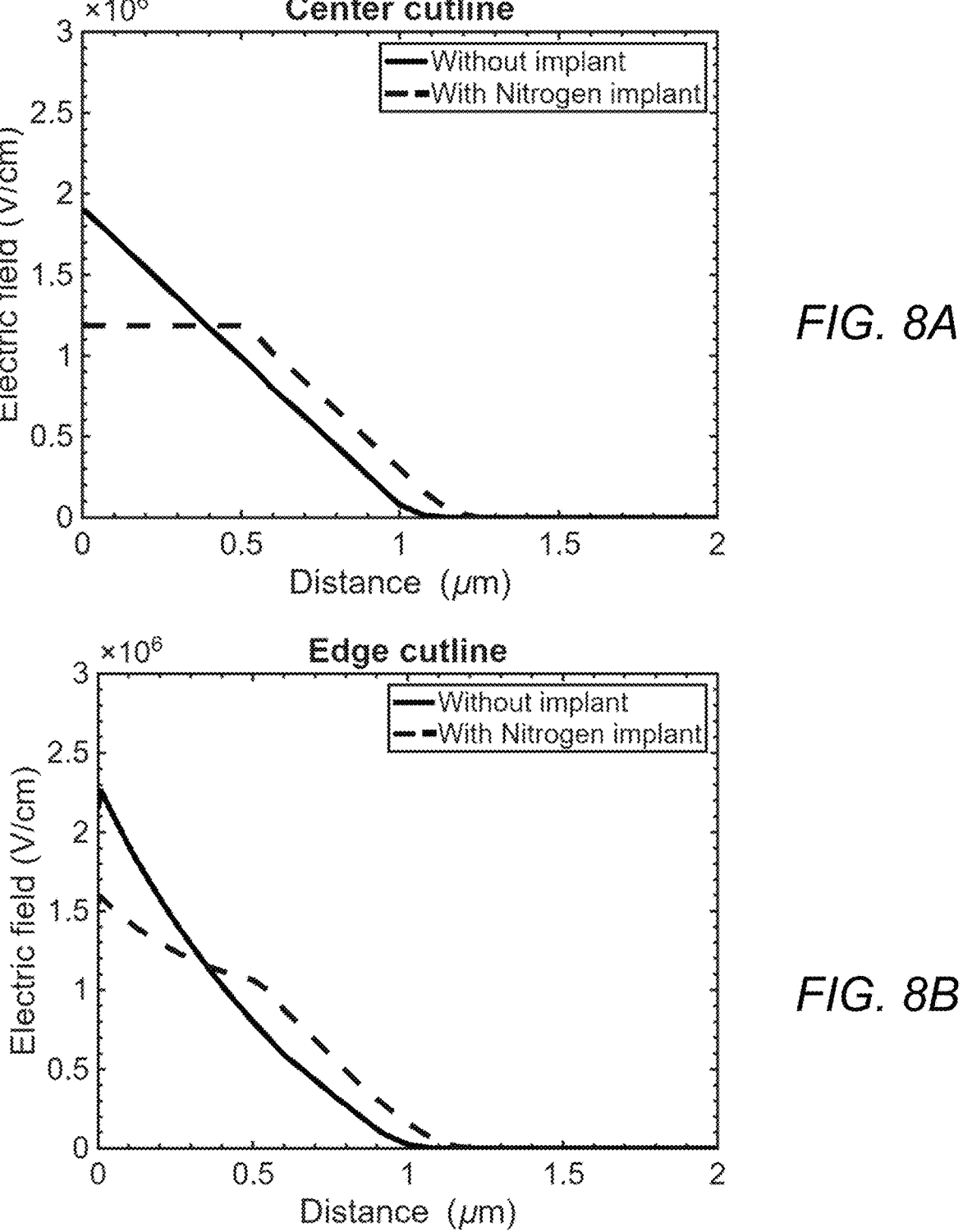
FIGS. 8A and 8B are plots showing the simulated electric field profile as a function of distance from the device surface (anode contact) through the CENTER cutline for devices having the electric field profiles shown in FIGS. 7A and 7B.

FIG. 8A shows the simulated electric field profile as a function of distance from the device surface (anode contact) through the CENTER cutline shown in FIGS. 7A and 7B. The peak electric field is significantly reduced as a result on the implant, leading to improved reverse leakage current and breakdown field of the P-MOSSBD device.

FIG. 8B shows the simulated electric field profile as a function of distance from the device surface (anode contact) through the EDGE cutline shown in FIGS. 7A and 7B. As with the electric field profile through the CENTER cutline shown in FIG. 8A, the peak electric field at the EDGE cutline is significantly reduced as a result on the implant, leading to improved reverse leakage current and breakdown field of the P-MOSSBD device.

Figures 9A, 9B:
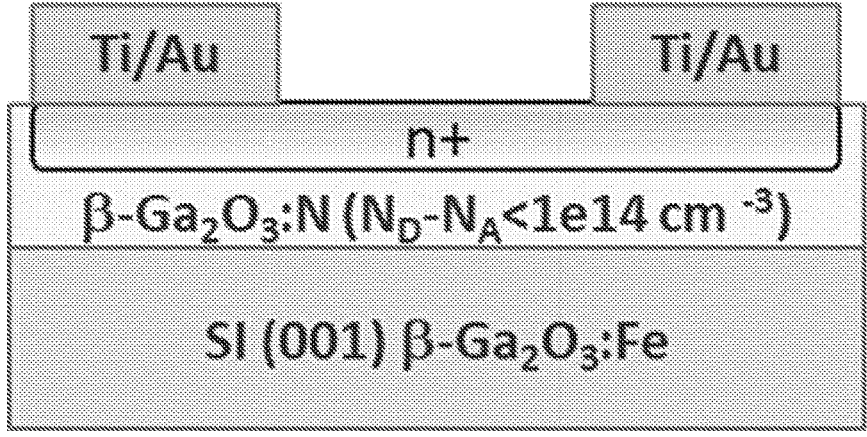
FIG. 9A and FIG. 9B show electrical characterization (Linear Transfer Length Method, LTLM, and Hall effect) of semi-insulating epitaxial Ga$_2$O$_3$ doped with Nitrogen during growth and subsequently implanted with donors (Si, Ge, and Sn) to form n-type regions. These results demonstrate the viability of donor-acceptor engineered Ga$_2$O$_3$ regions avoiding the need to etch the material to obtain the desired electric field profile.

FIG. 9A and FIG. 9B show electrical characterization (Linear Transfer Length Method, LTLM, and Hall effect) of semi-insulating epitaxial $Ga_2O_3$ doped with Nitrogen during growth and subsequently implanted with donors (Si, Ge, and Sn) to form n-type regions. These results demonstrate the viability of donor-acceptor engineered $Ga_2O_3$ regions avoiding the need to etch the material to obtain the desired electric field profile.

ADVANTAGES AND NEW FEATURES

The main new feature introduced by the present invention is the acceptor-implanted regions in between the Schottky diode regions of the vertical $Ga_2O_3$ rectifier to implement alternating n-type and semi-insulating (SI) regions contacting an anode metal layer. Although doping of $Ga_2O_3$ with acceptors such as Nitrogen may not result in p-type conductivity in the $Ga_2O_3$, such acceptors do substantially decrease its electrical conductivity, resulting in semi-insulating (SI) electrical behavior in acceptor-doped material. In this configuration, the rectifier achieves high forward bias current with low specific on-resistance when the anode is biased with positive voltage. In reverse bias, the leakage current is minimized due to the presence of the SI regions (with an optional gate dielectric deposited under the anode). A rectifier in accordance with the present invention thus operates similarly to a junction-barrier Schottky diode or a trench-MOS Schottky diode but does not require any etched structures or p-type regions, thus avoiding the formation of interface states related to etch damage and other reliability complications introduced by the integration of a dissimilar p-type material in the device. The presence of an acceptor-doped regions in the device further reduces the Fermi level near the anode in those regions, allowing for the low reverse current to persist at higher reverse bias compared to that of a Schottky diode. This effect may partially compensate for the absence of a space charge region induced by lateral depletion in a JBS or a trench-MOS diode, achieving similar or better overall performance.

ALTERNATIVES

A similar rectifier can be obtained by etching a trench in the epitaxial $Ga_2O_3$ (a.k.a., trench-MOS diode). See U.S. Pat. No. 11,081,598 to Sasaki et al., entitled "Trench MOS Schottky Diode" (2021) and U.S. Pat. No. 10,825,935 to Sasaki et al., entitled "Trench MOS-Type Schottky Diode" (2020); see also M. Mehrotra and B. J. Baliga, "Trench MOS Barrier (TMBS) Rectifier: A Schottky Rectifier with higher than parallel plane breakdown voltage," *Solid-State Electron.* 38 (4) 801-806, 1995. Integrating a p-type material on the surface of the Ga2O3 semiconductor can result in p-n or p-i-n diode operation which is based on pn junction theory (carrier diffusion) instead of Schottky diode theory (thermionic-field emission).

Other alternative devices are the junction-barrier Schottky (JBS) diode, where the regions contacting the anode are of alternative p- and n-type conductivity. In this JBS architecture, the rectifier resembles Schottky diode operation in forward bias and a pn diode in reverse bias. Variations of the JBS architecture, for instance the merged-pin-Schottky (MPS) diode, can be obtained by varying the p-type doping level in the JBS and termination regions.

In additional embodiments, instead of acceptor species, the $Ga_2O_3$ can be implanted with donor species such as Si, Ge, or Sn to form n-type regions of $Ga_2O_3$ within a semi-insulating epitaxial layer.

Although particular embodiments, aspects, and features have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

What is claimed is:

1. A rectifier having high forward bias current with low specific on-resistance, comprising:
   a $\beta$-$Ga_2O_3$ n-type drift layer on a $\beta$-$Ga_2O_3$ substrate; and
   a plurality of spatially defined semi-insulating regions of ion-implanted acceptor species formed in the $\beta$-$Ga_2O_3$ n-type drift layer;
   wherein unimplanted regions of the $\beta$-$Ga_2O_3$ n-type drift layer and the ion-implanted regions form alternating n-type and semi-insulating regions in the $\beta$-$Ga_2O_3$ drift layer; and
   wherein the ion-implanted acceptor species and a depth of the regions of ion-implanted acceptor species are configured to produce a predetermined electronic response in the rectifier.

2. The rectifier according to claim 1, wherein the rectifier is a planar metal oxide-type Schottky barrier diode (P-MOSSBD) rectifier having low on-resistance in forward bias and a low reverse current and high breakdown field in reverse bias.

3. The rectifier according to claim 1, wherein the ion-implanted acceptor species comprises nitrogen (N), magnesium (Mg), cobalt (Co), iron (Fe), beryllium (Be), calcium (Ca), strontium (Sr), zinc (Zn), or cadmium (Cd).

4. The rectifier according to claim 1, wherein the $\beta$-$Ga_2O_3$ n-type drift layer is n-doped with silica (Si) or germanium (Ge).

5. The rectifier according to claim 1, wherein the regions of ion-implanted acceptor species are uniformly spaced.

6. The rectifier according to claim 1, wherein the regions of ion-implanted acceptor species are non-uniformly spaced.

7. A rectifier having high forward bias current with low specific on-resistance, comprising:
   a $\beta$-$Ga_2O_3$ n-type drift layer on a $\beta$-$Ga_2O_3$ substrate;
   a semi-insulating $\beta$-$Ga_2O_3$ layer formed on the drift layer;
   a plurality of predetermined spatially defined N-type regions comprising donor ion-implanted species formed in the semi-insulating $\beta$-$Ga_2O_3$ layer;
   wherein unimplanted regions of the semi-insulating $\beta$-$Ga_2O_3$ layer and the donor ion-implanted regions form alternating semi-insulating and N-type $\beta$-$Ga_2O_3$ regions;
   wherein the species and a depth of the trenches of implanted donor species are configured to produce a predetermined electronic response in the rectifier.

8. The rectifier according to claim 7, wherein the rectifier is a planar metal oxide-type Schottky barrier diode (P-MOSSBD) rectifier having low on-resistance in forward bias and a low reverse current and high breakdown field in reverse bias.

9. The rectifier according to claim 7, wherein the donor species comprise Si, Ge, or Sn.

10. A method for forming a rectifier having high forward bias current with low specific on-resistance, comprising:
   forming a $\beta$-$Ga_2O_3$ n-type drift layer on a $\beta$-$Ga_2O_3$ substrate; and
   forming a plurality of spatially defined semi-insulating regions of ion-implanted acceptor species formed in the $\beta$-$Ga_2O_3$ n-type drift layer;
   wherein unimplanted regions of the $\beta$-$Ga_2O_3$ n-type drift layer and the ion-implanted regions form alternating n-type and semi-insulating regions in the $\beta$-$Ga_2O_3$ drift layer; and
   wherein the ion-implanted acceptor species and a depth of the regions of ion-implanted acceptor species are configured to produce a predetermined electronic response in the rectifier.

11. The method for forming a rectifier according to claim 10, wherein the rectifier is a planar metal oxide-type Schottky barrier diode (P-MOSSBD) rectifier having low on-resistance in forward bias and a low reverse current and high breakdown field in reverse bias.

12. The method for forming a rectifier according to claim 10, wherein the ion-implanted acceptor species comprises nitrogen (N), magnesium (Mg), cobalt (Co), iron (Fe), beryllium (Be), calcium (Ca), strontium (Sr), zinc (Zn), or cadmium (Cd).

13. The method for forming a rectifier according to claim 10, wherein the $\beta$-$Ga_2O_3$ n-type drift layer is n-doped with silica (Si) or germanium (Ge) Si or Ge.

14. The method for forming rectifier according to claim 10, wherein the regions of ion-implanted acceptor species are uniformly spaced.

15. The method for forming a rectifier according to claim 10, wherein the regions of ion-implanted acceptor species are non-uniformly spaced.

16. A method for forming a rectifier having high forward bias current with low specific on-resistance, comprising:
   forming a $\beta$-$Ga_2O_3$ n-type drift layer on a $\beta$-$Ga_2O_3$ substrate;
   forming a semi-insulating $\beta$-$Ga_2O_3$ layer formed on the drift layer; and
   forming a plurality of predetermined spatially defined N-type regions comprising donor ion-implanted species formed in the semi-insulating $\beta$-$Ga_2O_3$ layer;
   wherein unimplanted regions of the $\beta$-$Ga_2O_3$ n-type drift layer and the ion-implanted regions form alternating semi-insulating and N-type regions in the $\beta$-$Ga_2O_3$; and
   wherein the acceptor species and a depth of the trenches of implanted acceptor species are configured to produce a predetermined electronic response in the rectifier.

17. The method for forming a rectifier according to claim 16, wherein the rectifier is a planar metal oxide-type Schottky barrier diode (P-MOSSBD) rectifier having low on-resistance in forward bias and a low reverse current and high breakdown field in reverse bias.

18. The method for forming a rectifier according to claim 16, wherein the donor species comprise Si, Ge, or Sn.

19. The method for forming rectifier according to claim 16, wherein the trenches of implanted acceptor species are uniformly spaced.

20. The method for forming a rectifier according to claim 16, wherein the trenches of implanted acceptor species are non-uniformly spaced.

* * * * *